(12) United States Patent
Franke et al.

(10) Patent No.: US 6,661,671 B1
(45) Date of Patent: Dec. 9, 2003

(54) APPARATUS, METHOD AND ARTICLE OF MANUFACTURE FOR DETERMINING POWER PERMISSION FOR A BLADE SPANNING POWER BACK PLANES

(75) Inventors: Jeffery Michael Franke, Apex, NC (US); Edward Joseph Klodnicki, Durham, NC (US); Donald Eugene Johnson, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/306,303

(22) Filed: Nov. 27, 2002

(51) Int. Cl.[7] ................................................. H05K 5/00
(52) U.S. Cl. ..................... 361/752; 361/797; 361/802; 361/686; 361/796; 439/377
(58) Field of Search ................................. 361/752, 797, 361/724, 714, 796, 756, 741, 715, 727, 686, 802, 788, 785; 439/377, 74; 714/14

(56) References Cited

U.S. PATENT DOCUMENTS

| | | | | |
|---|---|---|---|---|
| 5,628,637 A | * | 5/1997 | Pecone et al. | 439/74 |
| 5,642,264 A | * | 6/1997 | Cantrell | 361/802 |
| 5,954,823 A | * | 9/1999 | Cutts et al. | 714/14 |
| 6,411,506 B1 | * | 6/2002 | Hipp et al. | 361/686 |
| 6,538,902 B1 | * | 3/2003 | Beard | 361/818 |

* cited by examiner

*Primary Examiner*—David Martin
*Assistant Examiner*—Hung Bui
(74) *Attorney, Agent, or Firm*—Martin J. McKinley

(57) ABSTRACT

A chassis controller can identify a blade that spans more than one power plane. If power is healthy and available on all power planes then the blade may be granted permission to power on. The chassis controller validates that when a blade spans multiple power planes that the necessary power is available before permitting the blade to go to fully power operation.

6 Claims, 10 Drawing Sheets

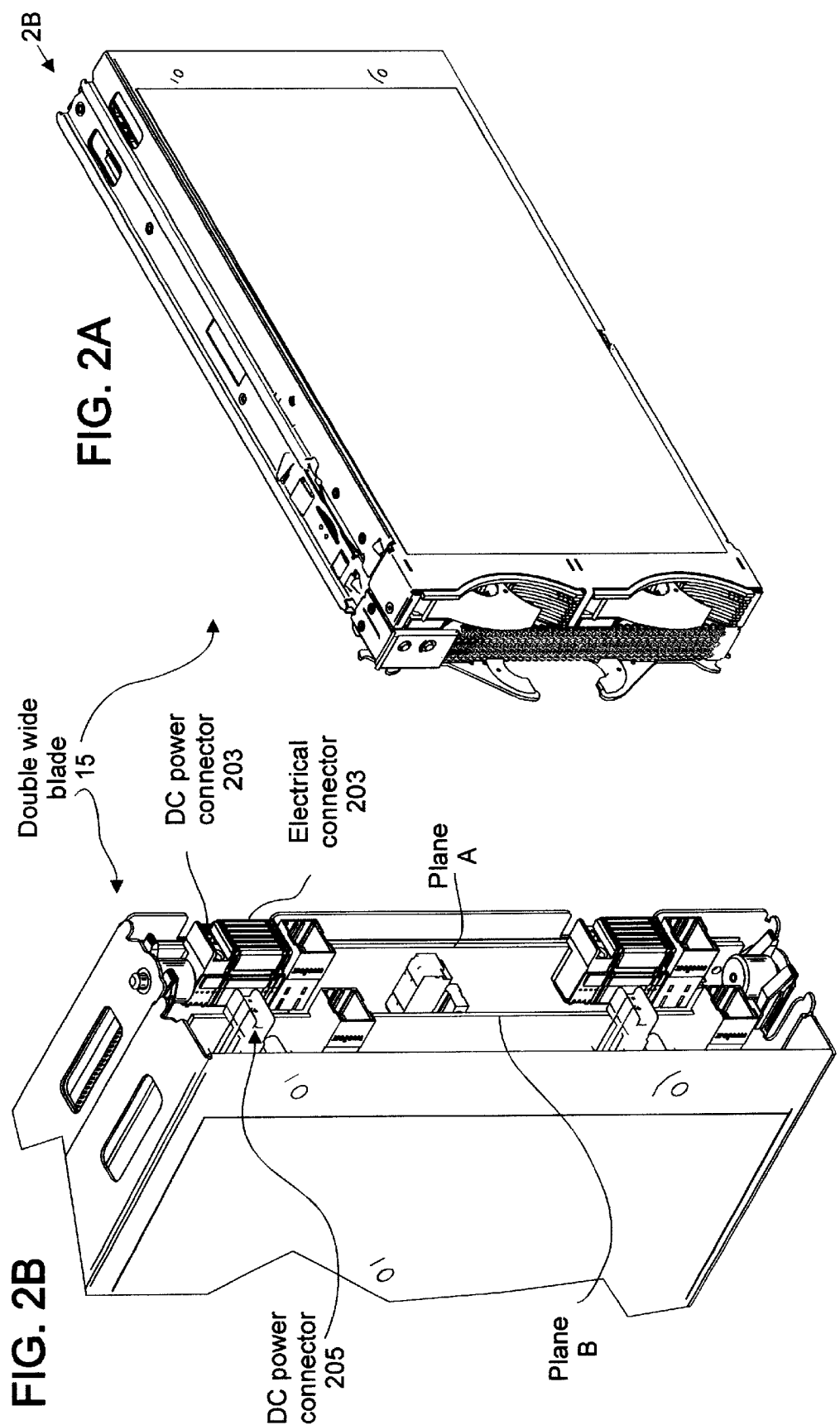

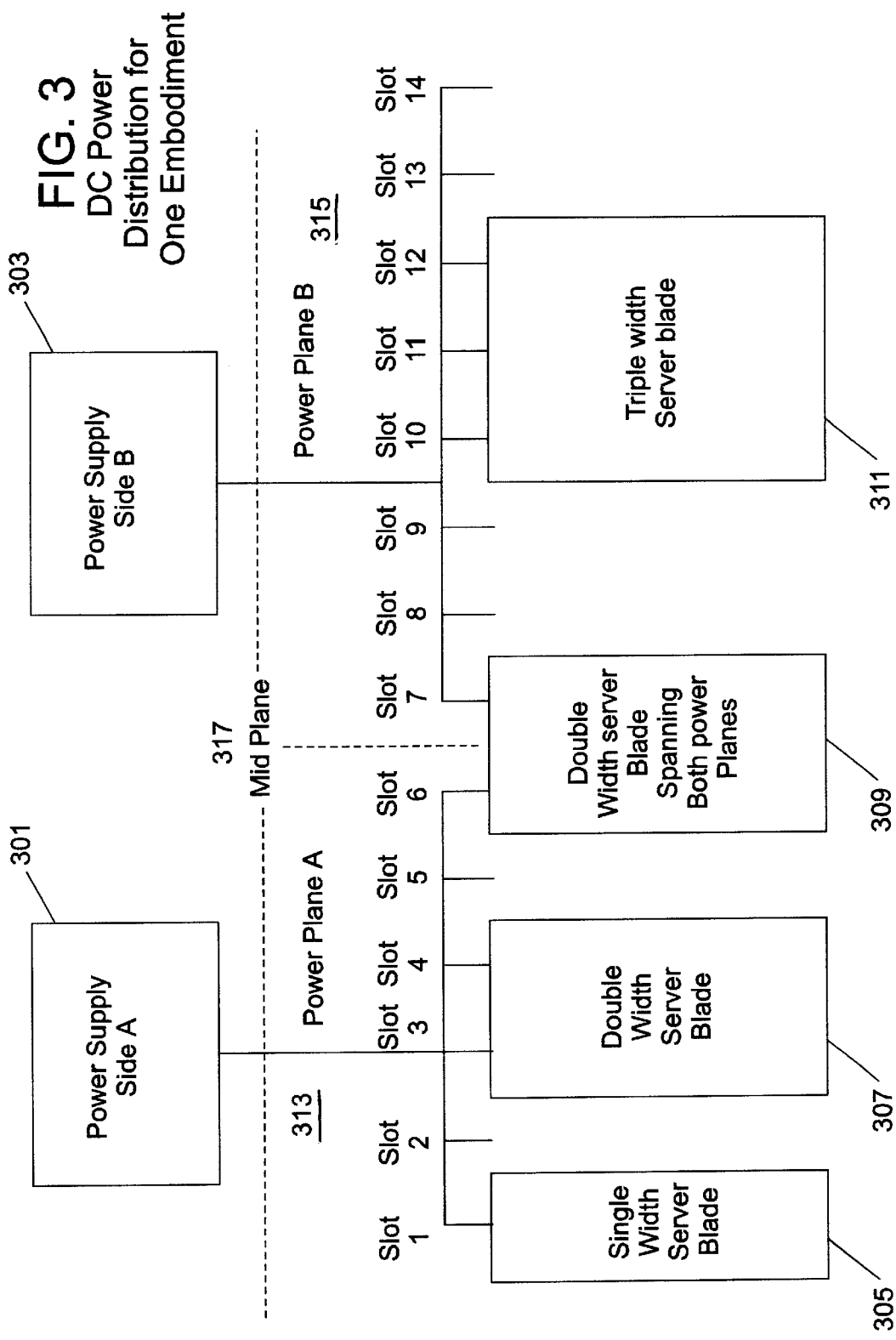

Chassis Controller

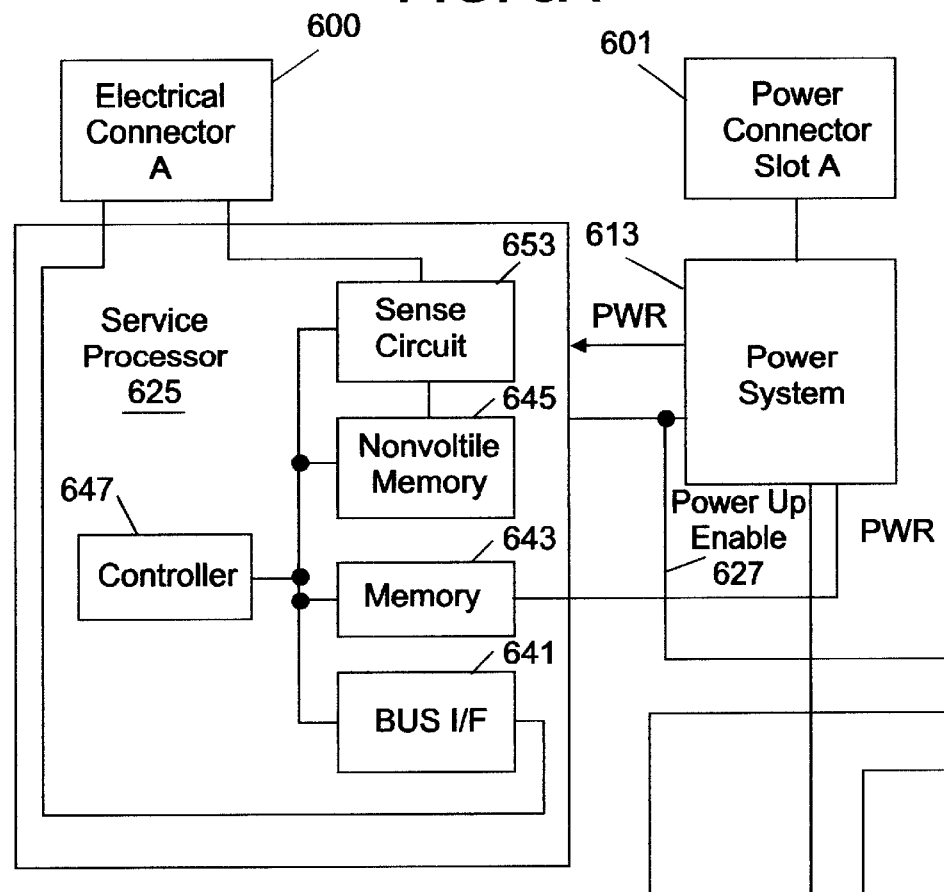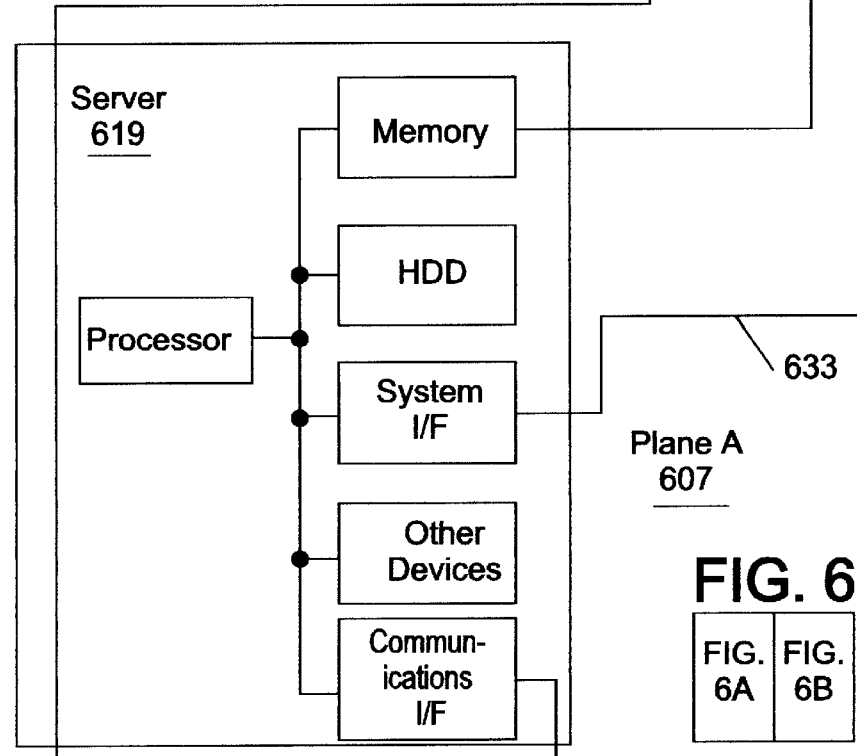

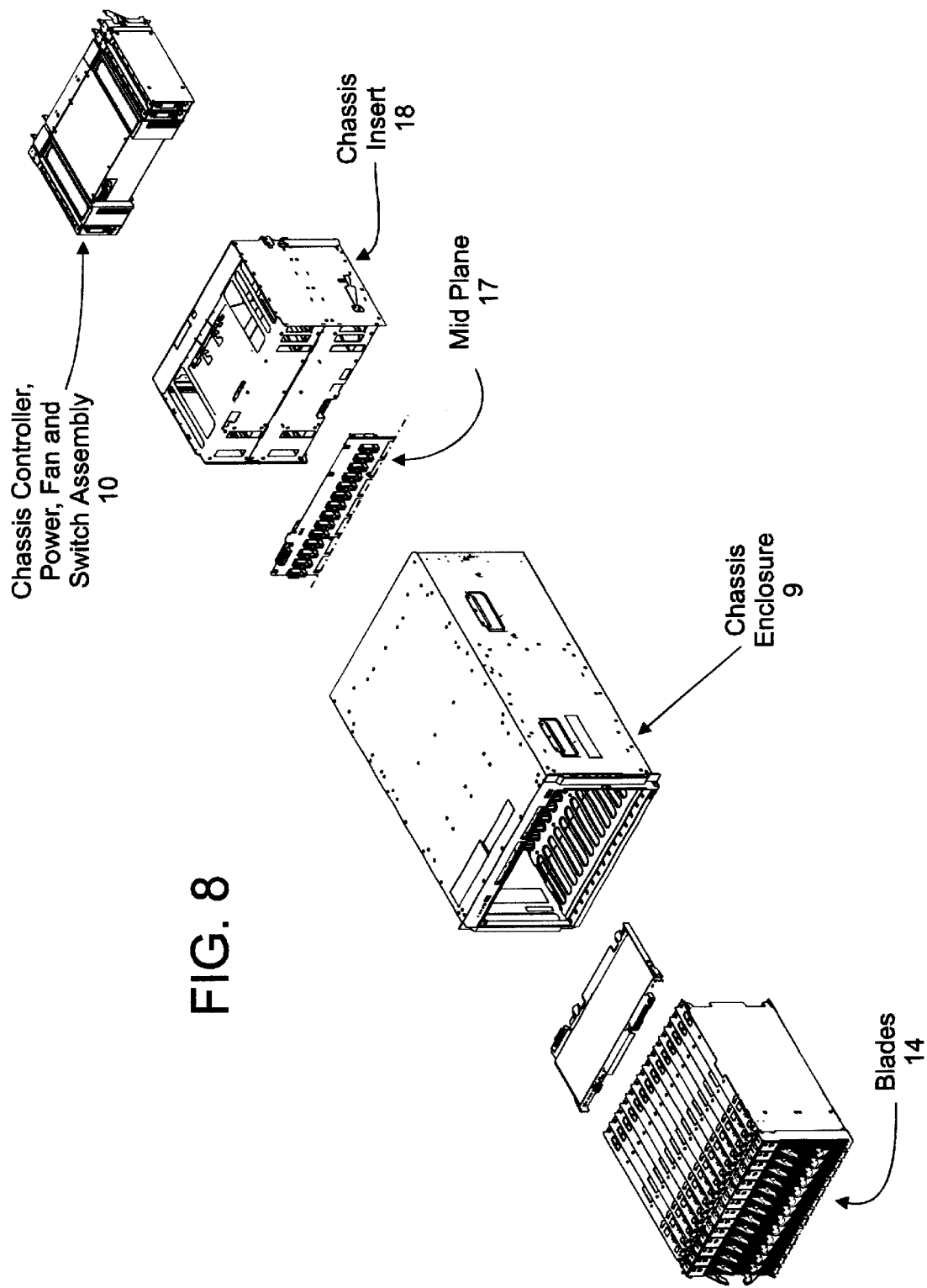

APPARATUS, METHOD AND ARTICLE OF MANUFACTURE FOR DETERMINING POWER PERMISSION FOR A BLADE SPANNING POWER BACK PLANES

BACKGROUND OF THE INVENTION

1. Field of the Invention

The present invention relates to protection of multi-slot blades that operate within a chassis designed to provide power with more than one power supply. The present invention prevents a multi-slot blade from fully powering up when one or more of the slots occupied by the multi-slot wide blade is un-powered or not powered properly. More particularly, it relates to an apparatus and method for assuring that the required power supplies are available before enabling full power to the blade or for enabling shutdown of full power mode for a multi-slot blade when the blade is serviced by a failing power supply or a power supply is being removed.

2. Description of the Problem Solved by the Present Invention

Systems containing a number of insertable and removable components needs to be able to manage the power supplied to these components in conformance with power requirements that may vary from country to country. Power flow through any power distribution network needs to be limited to some assured threshold in order to design systems inexpensively, assure systems reliability and to comply with government or agency standards. In such systems there is a maximum power that can be supplied to an individual insertable component due to power requirements. Some components may require more power than the system permits for any given component. Some components may need more space than that allocated for the insertable and removal components in order to add required functionality and take advantage of economies scale. These multiple wide components use more space and require additional power.

Multiple power supplies may be used to supply power to the insertable and removal components. Multiple power supplies are used to enhance overall system's reliability, meet the growing demand for more power from the insertable and removable components and provide cost flexibility to end users (purchase and install the power supply when it is needed). However, if a multi-wide component is inserted into the system such that parts of the multi-wide component would not be properly supplied with power the component could be severally damaged, power flow could exceed design thresholds, or other system components could be damaged.

These unresolved problems and deficiencies are solved by the invention in the manner described below.

SUMMARY OF THE INVENTION

The above-mentioned needs have been met in accordance with the present invention by providing for an apparatus, method and article of manufacture that satisfies these needs. Accordingly, it is an object of the present invention to solve a manageability problem in a chassis with multi-wide blades connected to two different power planes. Some multi-wide blades may use power from more than one power source by spanning multiple connection points. If a multi-wide blade is connected to more than one power plane and one of the power sources is missing or failed then the blade should not be powered on, otherwise electrical damage may occur, or power may be disrupted to the other components on the working supply.

It is an object of the invention to prevent multi-slot blades from being damaged because inadequate power is being supplied.

It is an object of the invention to enable the safe use of multi-slot blades.

It is an object of the present invention to reduce the cost of providing server functionality in blades by sharing common components.

Accordingly, the present invention provides for a chassis controller (e.g., or management module or a service processor for a chassis) that identifies a blade that spans more than one power plane. When needed the chassis controller can detect the presence of a power supply and query the power supplies health and status. The chassis controller can disable the blade from powering on. If power is good from all power planes then the blade may be granted permission to power on. A single width blade obtains power from only one power supply associated with the slot's power connecter, where a X width blade obtains power from two or more power connectors associated with the slots that the blade occupies. When a blade is installed in a position that draws power from more than one power source, each required power supply must be installed and healthy. The chassis controller validates that when a blade spans multiple power planes that the necessary power is available.

BRIEF DESCRIPTION OF THE DRAWINGS

The foregoing and other objects, aspects and advantages of the invention will be better understood from the following detailed description with reference to the drawings, in which:

FIG. 2A depicts a front view of one embodiment of a double wide blade.

FIG. 2B depicts a rear view portion of a double wide blade.

FIG. 3 depicts one embodiment of DC power distribution within the chassis.

FIG. 8 is a front, top and right side exploded perspective view of a chassis system of the present invention.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numbers signify like elements throughout the description of the figures.

The present invention may be embodied as methods, systems, and/or software products. Accordingly, the present invention may be embodied in software (including firmware, resident software, micro-code, etc.). Furthermore, the present invention may take the form of a software product on a processor-usable or processor-readable storage medium having processor-usable or processor readable program code embodied in the medium for use by or in connection with an instruction execution system. In the context of this document, a processor-usable or processor readable medium may be any medium that can contain, store, communicate, propagate, or transport the software for use by or in connection with the instruction execution system, apparatus, or device.

Figure 1A:
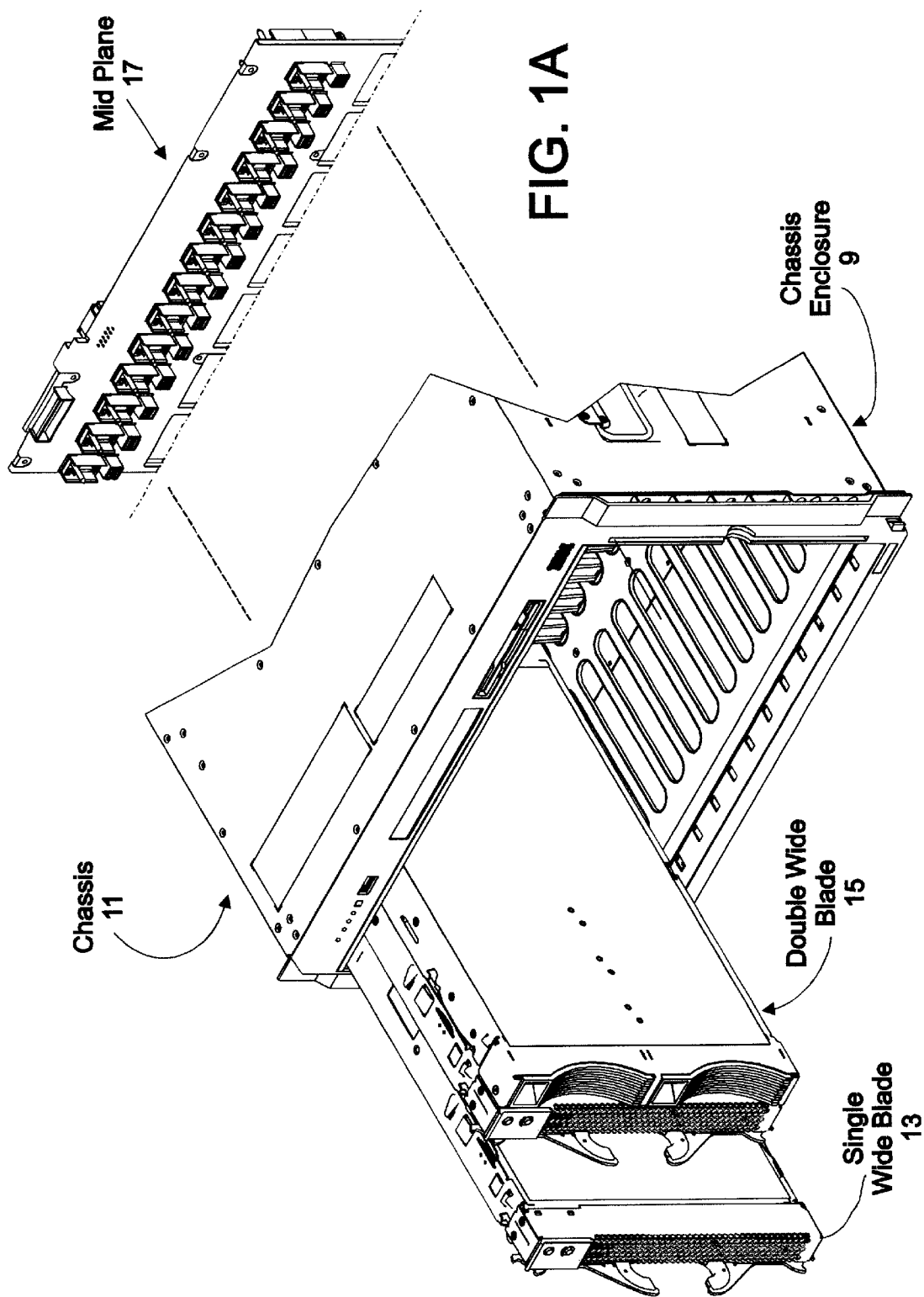
FIG. 1A is a front view of a chassis showing various components.
Figure 1B:
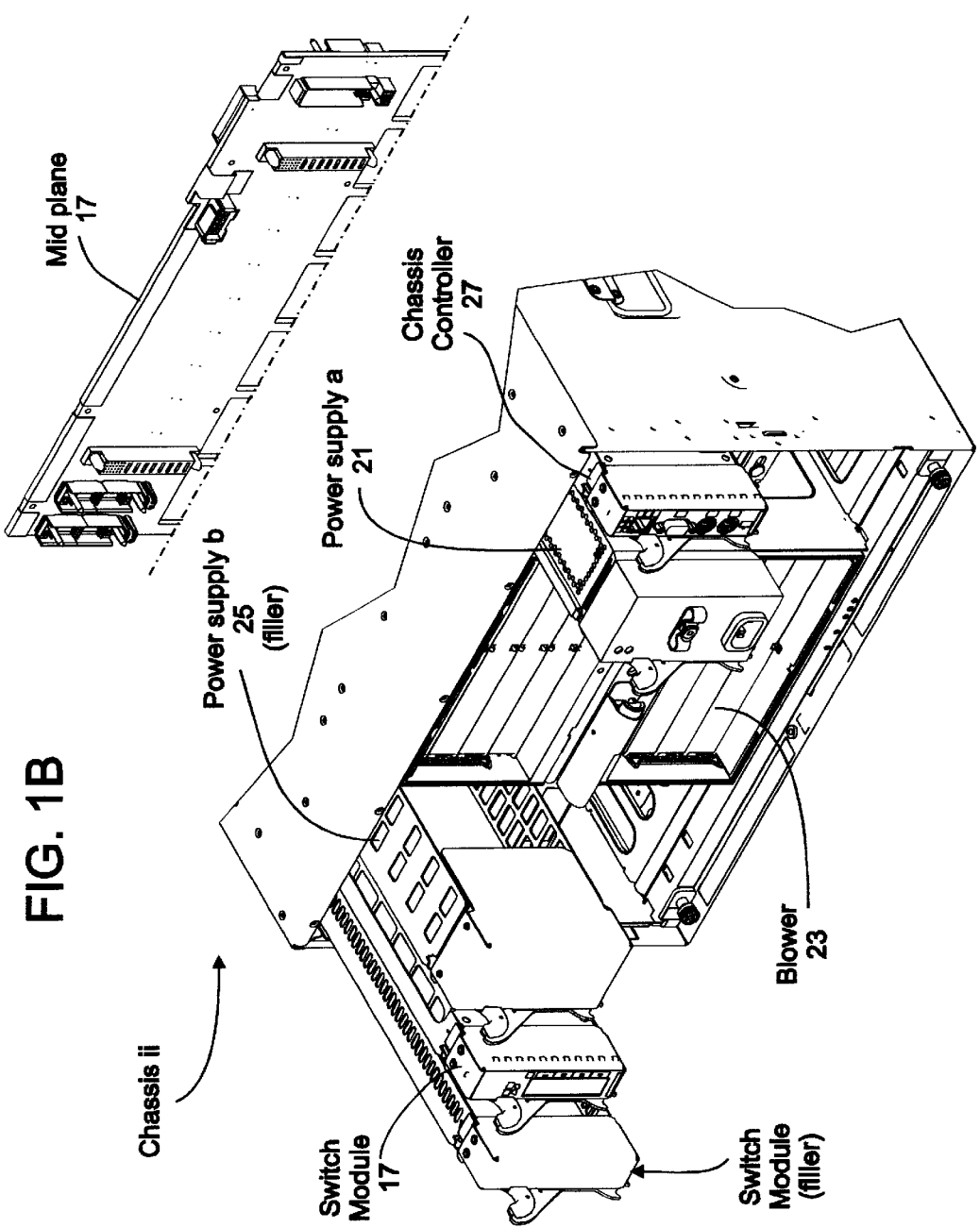
FIG. 1B is a rear view of a chassis showing various components.

FIG. 1A depicts a chassis 11 with a single wide blade 13 and double wide blade 15 and a total of fourteen blade slots shown. Midplane 17 is depicted in FIG. 1. FIG. 1B depicts switch module switch module 19, power supply A 21, power supply B 25, blower 23 and chassis controller 27. Midplane 17 is a board which provides connectors for all blades, power supplies, switch modules, the chassis controller 27 and it also provides the interconnections between subsystems. Midplane 17 provides a power connection and electrical interface connection for each slot. Switch module 19 may be included and can provide multi-port Ethernet or Fibre Channel switches for use by all of the blades and the chassis controller 27. The power modules 21 and 25 provide DC operating voltages for the chassis components including the chassis controller 27, the blades and other components. The power supply B 25 is needed if all slots are to be fully populated with blades. Power supply B 25 may be used as a backup power supply to power supply A until it is needed. The components (power supplies, switch, chassis controller, blades, blower) are hot plugable subsystem modules. Each power supply provides enough power to support state of the art processors on the blades.

FIG. 1B is a rear, top and left side perspective view of the rear portion of the chassis system. The rear portion of the chassis houses various hot plugable components for cooling, power, control and switching. Chassis insert 18 slides and latches into the rear of main chassis enclosure 9.

The chassis 11 also provides interconnections via midplane 17 between the blades, power, fan, chassis controller, high speed communication ports, and shared resources such as a front panel, CD-ROM drive, and diskette drive. Blades may interface with other sub systems in a chassis via one or more of following electrical interfaces: RS485, Analog video, USB, Ethernet, I2C, miscellaneous control signals and DC power (i.e., 12V continuous Power and GND). These interfaces provides the ability to communicate to other sub systems in the chassis such as chassis controller and switches. Each blade plugs into the midplane 17 via an electrical interface that may provide for one or more the foregoing electrical interfaces. Midplane 17 is positioned approximately in the middle of chassis 11 and includes two rows of connectors; a top row including connectors for supplying DC power to blades and a bottom row including connectors for supplying an electrical interface to the blades. Thus, each one of the 14 slots includes one pair of midplane connectors which can mate to a pair of connectors at the rear edge of each blade. The chassis controller (e.g, chassis service processor or management module) 27 provides basic management functions such as monitoring, alerting, restarting, and blade power enablement. The chassis controller 27 may also provide other functions required to manage shared resources, such as the ability to switch keyboard, video, and mouse signals. FIG. 8 depicts an exploded view of a chassis with its fully populated components.

Blades may be of various types including server blades or processor blades or mass storage blades or other types of blades. A server blade is a subset of an industry standard server that is implemented as a thin, pluggable card with or without a protective cover. Single wide blade 13 is shown in slot 1 of chassis enclosure 9. Each blade connects to a midplane 17 from which it may derive its power, cooling, network connectivity, management functions, and access to shared chassis resources (such as a front panel, CD-ROM drive, and diskette drive, etc.). In addition to a main processor and memory, server blades may provide for attachment of other devices such as PCI adapter cards, additional memory and local hard-files. These additional devices may be attached via a daughter card. A blade may provide one or more processors, memory, and firmware of an industry standard server. In addition, blades may incorporate virtual resource managers, keyboard, video, and mouse interfaces, and up to 4 Ethernet ports. Each blade requires a service processor for sending and receiving commands to and from the chassis controller.

As shown in FIG. 1 double wide blade occupies two slots of the chassis 11. FIG. 2A and FIG. 2B depict the front and rear views of a double wide blade 15, respectively. Double wide blade 15 is depicted with a protection cover which may enclose more than one plane (card, mother board or planer) or both or which may be 'snap together' to form multi-plane unit that occupies multiple mid-plane slots. As shown in FIG. 2B, an electrical connector 201 provides an electrical interface to the chassis via midplane 17. A first power connector 203 is shown for receiving DC power from a first slot and a second power connector 205 is shown for receiving DC power from a second slot.

FIG. 3 depicts a logical view of DC power distribution within the chassis. Power supply A 301 provides DC power, via the midplane 317, to slots 1–6 referred to as power plane A 313. Power supply A 301 may also supply power to the chassis controller, blower, switch and other chassis components. Power supply B 303 provides DC power, via the midplane 317, to slots 7–14 referred to as power plane B 315. Power supply B 303 may also supply power to the chassis manager, blower, switch and other chassis components. One of the power supplies must be present in order to power any blades. The single wide server blade 305 shown in slot #1 obtains DC power from the DC power connection to the midplane associated with slot #1. Double wide server blade 307 shown in slot #3 and #4 receives DC power from power supply A 301 via the midplane power connection for slot #3 and slot #4. Double wide server blade 309 crosses power plane A 313 and power plane B 315. Double wide server blade 309 receives DC power from power supply A 301 and power supply B 303 via midplane connection for slots #6 and #7. Triple wide server blade 311 shown in slot #10, #11 and #12 receives DC power from power supply B 301 via the midplane power connection for the slots occupied. If either power supply were to be removed, fail or not be present than the chassis controller would need to prevent double wide server blade 309 from fully powering up or cause the double wide server blade to power down.

Figure 4:
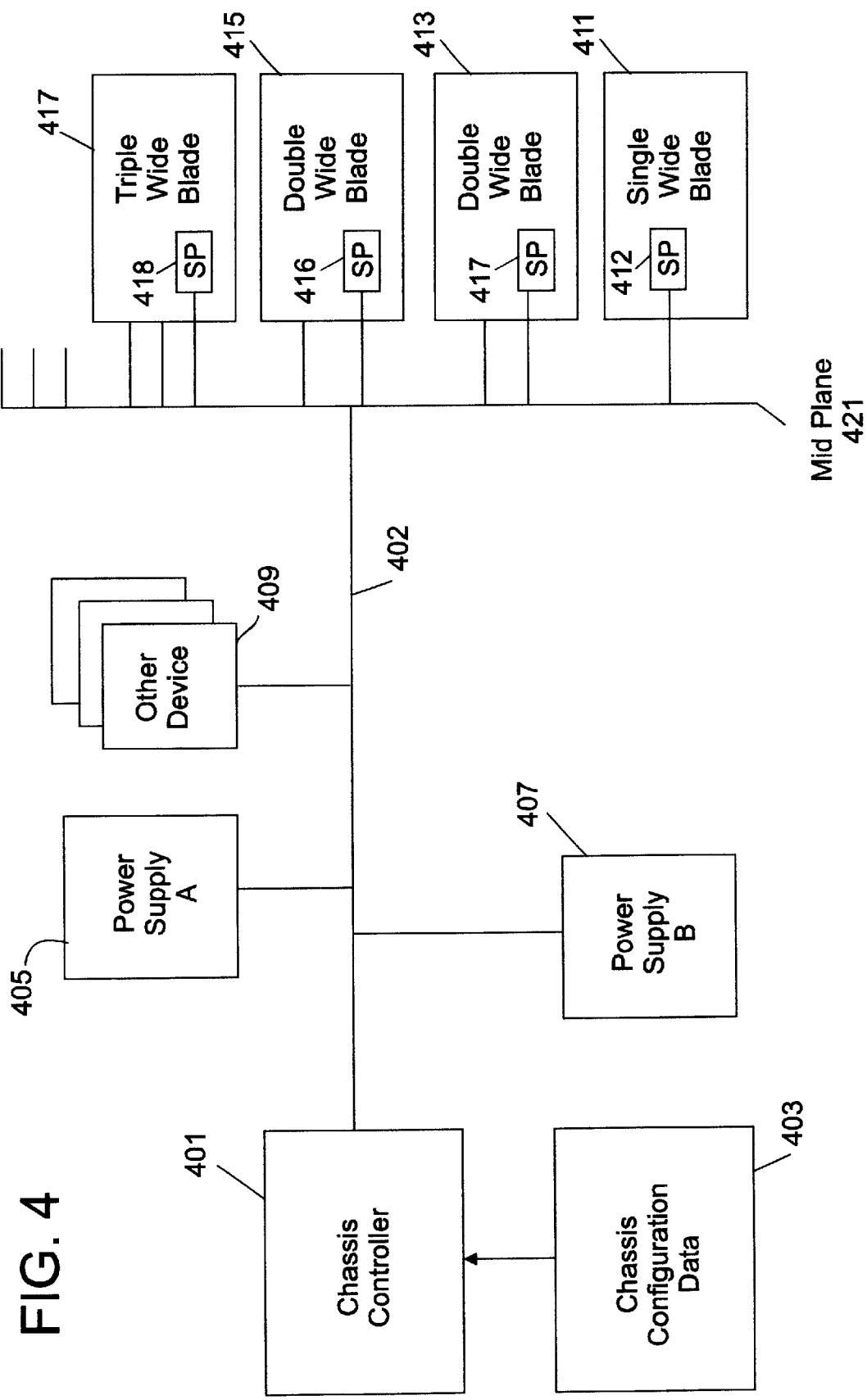
FIG. 4 depicts a logical communication connectivity between various components.

FIG. 4 depicts a logical communication's connectivity between various components. As depicted the chassis controller 401 can communicate with any of the chassis components including: power supply A, power supply B and the service processors (418, 416, 414, 412) of the various installed blades (411, 413, 415, 417). The chassis controller 401 can obtain or receive status information and configuration data from each of the components. The chassis controller 401 may also control, direct and/or manage the components via the interconnection bus 402. The interconnection bus 402 might be implemented as USB, I2C, RS-485 or any other type of interconnect bus or communication interface. The interconnection bus 402 may use different types of busses to communicate to different types of components. For instance, the chassis controller may instruct a particular service processor of an installed blade to go to fully power on. The chassis controller 401 may simply enable a particular service processor to go to fully power mode if the service processor determines that other conditions are satisfied. The chassis controller might deny permission for full power mode by not enabling full power mode or an express command denying full power permission. Although shown as bus 402, any communication scheme or network may be used by the chassis controller 401 to communicate with installed components. In addition to the blades (411, 413, 415, 417) and power supply A 405, power supply B 407, and midplane 421 the chassis controller may also communicate or interface with other components such as switches, cd-rom, displays or blowers.

The chassis controller 401 also has access to component presence information that may be a bit in a presence register for each component that indicates the presence or absence of a particular component. The chassis controller may communicate with components by making inquires of components (send status or read status) or may be interrupt or event driven or any combination of these techniques. Chassis configuration data 403 may contain data on power planes boundaries (i.e., which slots are supplied with which power supplies or not supplied) and other chassis information (type, revision level, serial number, machine type model number, universal unique ID, requirements etc). Although not depicted each component, including the chassis controller may have its own configuration data. As with the chassis component configuration data may include component: type, revision level, serial number, machine type model number, universal unique ID, blade width, multi-slot orientation, and other requirements etc). The chassis controller 401 can obtain configuration data from each installed component via bus 402 and appropriately configure the installed components. The Chassis controller has access to the presence, health and status of all installed components via the bus 402. Bus 402 may also support a component addressing scheme which permits the chassis controller to talk with each component individually. This may require the components be able to determine their address on the bus. In the preferred embodiment the bus 402 is an I2C bus and each power supply provides I2C read/write registers to support status/control by the chassis controller. Other modules (blower, switch etc) may be controlled over this bus, a multiplexed sub bus or a separate serial bus such as I2C. An RS485 serial bus couples the blades to the chassis controller for management and control of the blades.

Figure 5:
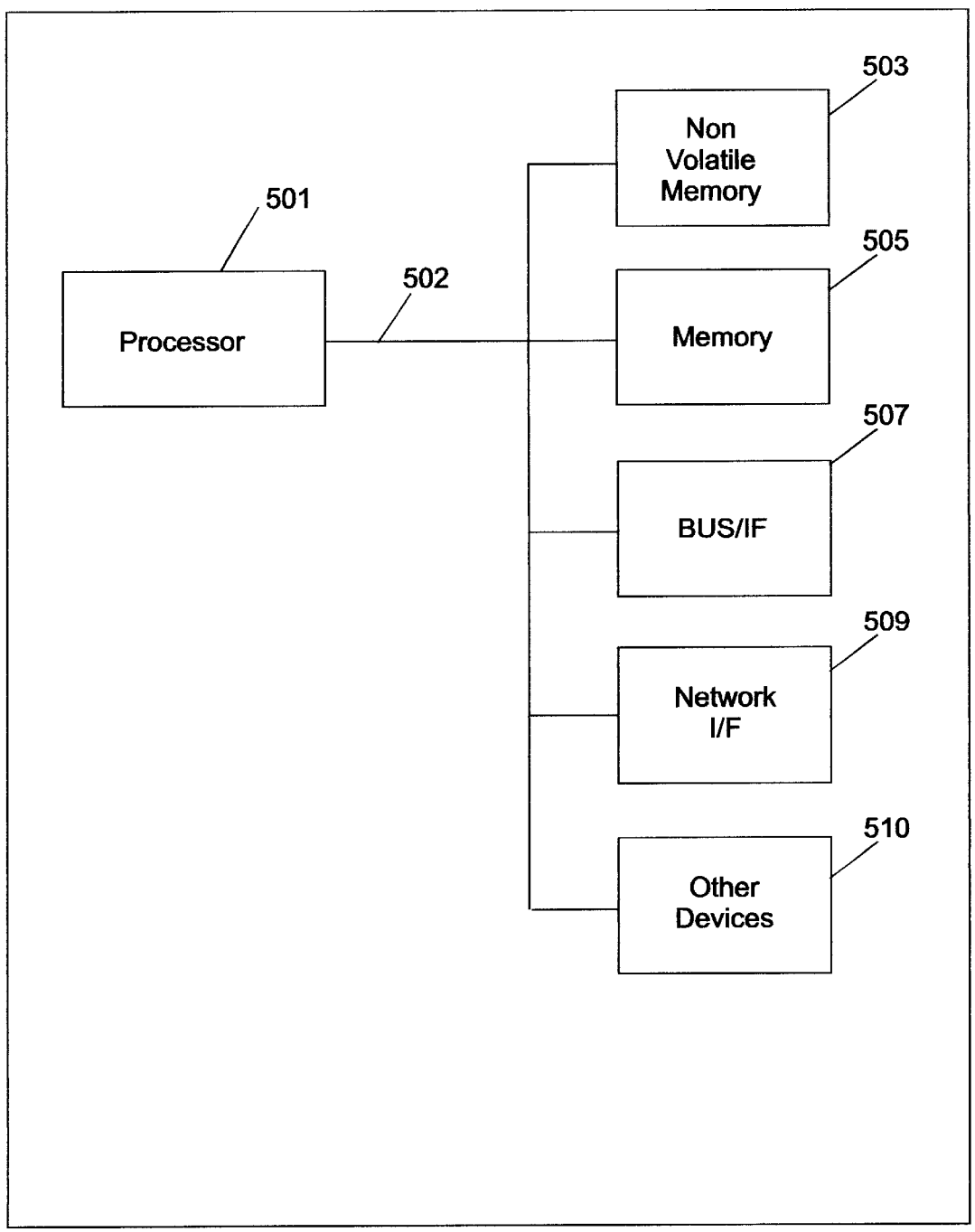
FIG. 5 shows a logical overview for one embodiment of the chassis controller.

FIG. 5 shows a logical overview of one embodiment of the chassis controller. A processor 501 is connected via a bus 502 to nonvolatile memory 503 (Flash, EEPROM, Compact flash, etc)

FIG. 5 illustrates a processor 501 and a memory 505 in accordance with embodiments of methods, systems, and software products for the present invention. The processor 501 may be, for example, a microprocessor, central processing unit, controller, micro controller or embedded controller or processor. The memory 505 is representative of the overall hierarchy of memory devices containing the software and data used to implement the chassis controller in accordance with the present invention. The memory may include, but is not limited to, the following types of devices: cache, ROM, PROM, EPROM, EEPROM, flash, SRAM, and DRAM. The memory 505 may hold various categories of software and data: the operating system or kernel that enables the chassis controller to boot up and operate, the software that operates the chassis controller functions, data such as configuration data or systems data and component status data. The chassis controller 501 communicates to other components through one or more bus interfaces 507. The bus interface 507 is the preferred mechanism for communicating with the service processor of each installed blade. In addition to or in lieu of the bus interface 507 the chassis controller may interface with other system components via a network interface 509 such as ethernet. The chassis controller may generate alert messages and event messages as required by overall system or network management entities. It may send these messages to an operator console or other management agent via the switch module. The chassis controller may also include hard disk drive and other computer components for attaching other devices such as keyboard, mouse, display, disk drives etc.

Upon detection of a blade, either as a result of a power-up initialization of the chassis or a blade being inserted into an operational chassis, the chassis controller will validate chassis configuration, may write configuration data to the blade, and override defaults before allowing the blade to power up.

Each processor blade has a dedicated service processor (SP) for sending and receiving commands to and from the chassis controller. A management and control protocol allows the chassis controller to authenticate individual blades as part of the blade activation procedure. The chassis controller can also form and send alerts to a remote console to indicate changes in status, such as removal or addition of a blade or module. The chassis controller provides access to the internal management ports of the switch modules and to other major chassis subsystems (power, cooling, control panel, and media drives). The chassis controller communicates with each processor blade service processor via the out-of-band serial bus, with the chassis controller acting as the master and the blade's service processor acting as a slave. Addresses may be hardwired for each slot on the midplane connector, and used by a blade's service processor to determine which processor blade is being addressed on the serial bus.

Figure 6B:
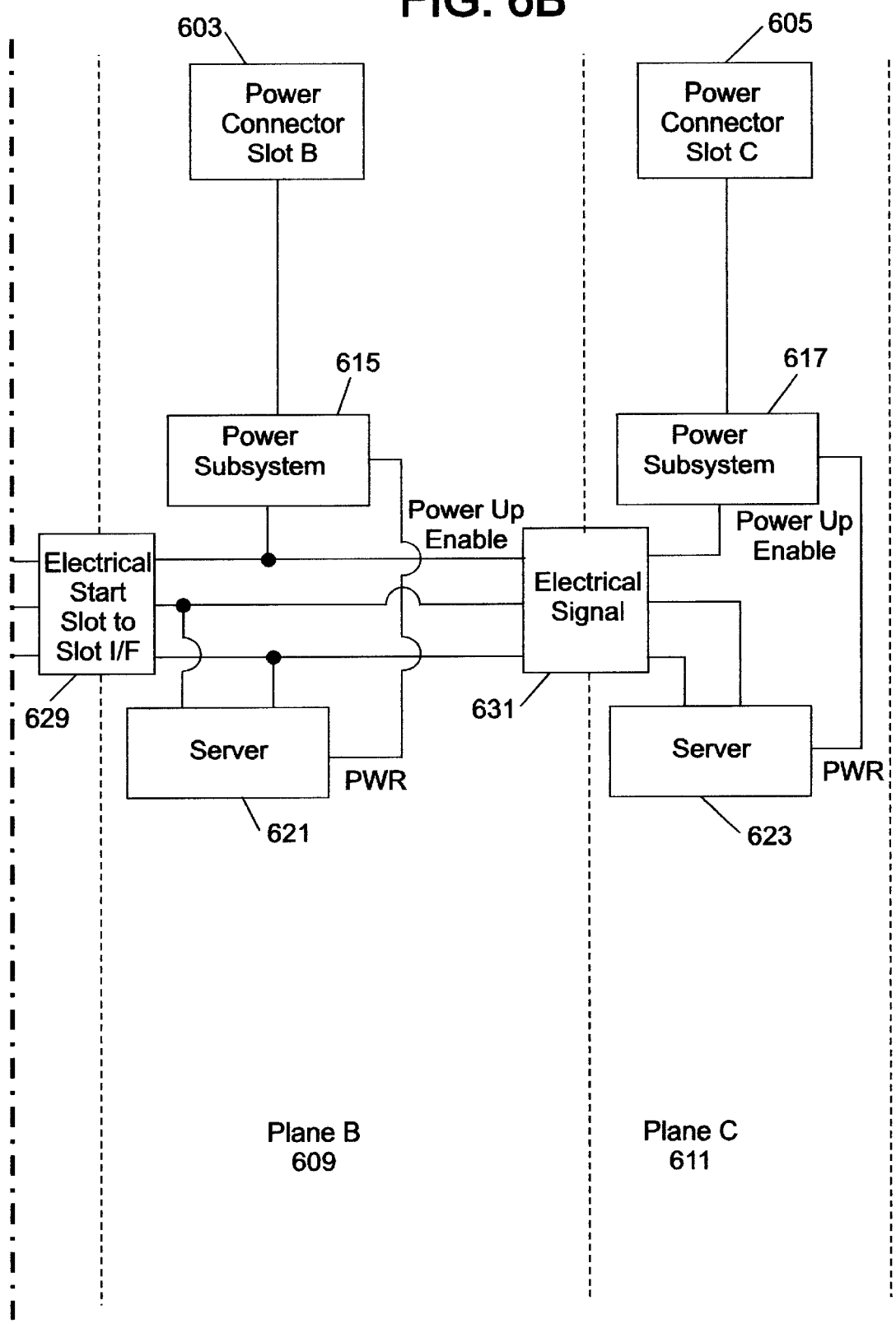
FIG. 6 (6A, 6B) depicts a logical view of a triple wide server blade.

FIG. 6 depicts a logical view of a triple wide server blade. The triple wide blade will occupy three slots when inserted into a chassis. Three power connections (601, 603, 605) permit power to be flow from the chassis to each power plane of the blade (plane A 607, plane B 609, plane C 611). Each plane which may be logical or physical. Each plane has an associated power subsystem (613, 615, 617). Each power subsystem may provide multiple voltage levels and required power conditioning and regulation required by the circuit elements and components needing power in the blade. For example, with an input voltage of 12 volts the power subsystem may distribute DC power at voltages such as: +−1.5V, +−3V, +−5V, or any other voltages required by the blade. The power subsystem distributes the DC power supplied through their respective planes. An alternative embodiment permits different power systems to provide different voltages across the planes. Thus, power subsystem 613 might provide +5V through out the blade via electrical connectors 629 and 631.

The power subsystems (613, 615, 617) do not distribute power to their respective blade main functions (illustrated as servers 619, 621, 623 in FIG. 6) unless the power up enable signal has been set by service processor 625. The power up enable signal 627 may be a signal that the SP 625 sets, controls or a command that the SP 625 issues. No DC power is made available to the main functions of the blade until the SP 625 enables or grants permission to each of the power subsystems. Note that the planes have an electrical interconnection via electrical connector (629, 631) that can carry signals and commands between the planes. The planes may be separate printed circuit boards, planar boards or mother boards. The planes may include separate protection covers which swap together to form the triple wide server blade.

The SP 625 receives power from the power subsystem 613. Power is supplied to the SP 625 regardless of whether the power up enable signal has been set. This enables the SP 625 to perform necessary monitoring functions prior to enabling fully power up of the blade. The SP 625 is coupled to the chassis and chassis controller via electrical connector A which connects to a connector on the midplane. The SP 625 includes a bus interface 641 for communicating with the chassis controller. The chassis controller will instruction or permit the service processor 625 to go to full power mode and enable the power enable signal 627. The SP 625 may provide or provide access to blade configuration data, stored in nonvolatile memory 645, to the chassis controller. Nonvolatile memory also contains instructions for the processor that enable the SP 625 to boot up and operate. In accordance with the present invention blade configuration data includes blade width. The blade depicted in FIG. 6 would have a blade width of three. The bus interface 641 enables the SP 625 to provide or provide access to status information for the blade. As with the chassis controller the SP 625 may include any type of processor. The SP 625 also may include sense circuitry 655 for sensing or determining information about the chassis such as slot address.

The triple wide blade depicted in FIG. 6 contains three servers (619, 621, 623) which provide the main functions for the blade. These servers share a common service processor 625 which allows for more space for other functions on plane B 609 and plane C 611. These servers (619, 621, 623) may be interconnected by a system bus or other communications interface or network interface or busses. Other computer related functions may be provided as main functions such multi-processor, mass disk, and memory. The servers interconnect to the chassis by virtue of electrical connection 600. Each plane may be provided with its own electrical interface to the chassis via the associated slot's electrical interface.

Operation

Upon installation of a blade, the blade service processor will initialize blade power to the "off" condition (power up disabled), assuming the applicable power module is installed and continuous power is available to the service processor. Power to the blade will remain disabled until the chassis controller has completed initialization of the blade and validated that the blade configuration is consistent with chassis configuration. During initialization the chassis controller can modify power control states for the blade as dictated by configuration policies established for the blade. Upon successful completion of the blade initialization and configuration, the chassis controller may issue a command or signal to the blade service processor indicating the power on cycle may resume or fully power up permission is granted. Upon receiving this command or signal, the service processor will enable power to the blade.

Subsequent power cycles will be dependent upon power control policies in effect for the blade and are subject to modification by the chassis controller as directed by management policy. The chassis controller is in ultimate control of the blade's power state. When the chassis controller is reinitialized, it must poll each of the blade service processors to recover state information and ensure uninterrupted operation. Activation of the hot remove signal resulting from physical efforts to remove the blade from the chassis while power is applied to the slot will be sensed by the service processor. Upon sensing this signal, the blade service processor will attempt to post an alert to the chassis controller. If the blade is removed, the service processor may inform the chassis controller or the chassis controller may sense the activity on the presence bit and post an alert. Activation of the hot remove signal resulting from physical efforts to remove a power supply module from the chassis will be sensed by or reported to the chassis controller. The chassis controller can the initiate shut down of all blades installed in slots getting power from the power supply being removed including any multi-wide blade that crosses a power plane boundary including at least one slot serviced by the power supply being removed. An operator may also provide notice to the chassis controller prior to power supply removal. The chassis controller may take similar actions if it senses from status information that a power supply is failing or about to fail.

Figure 7:
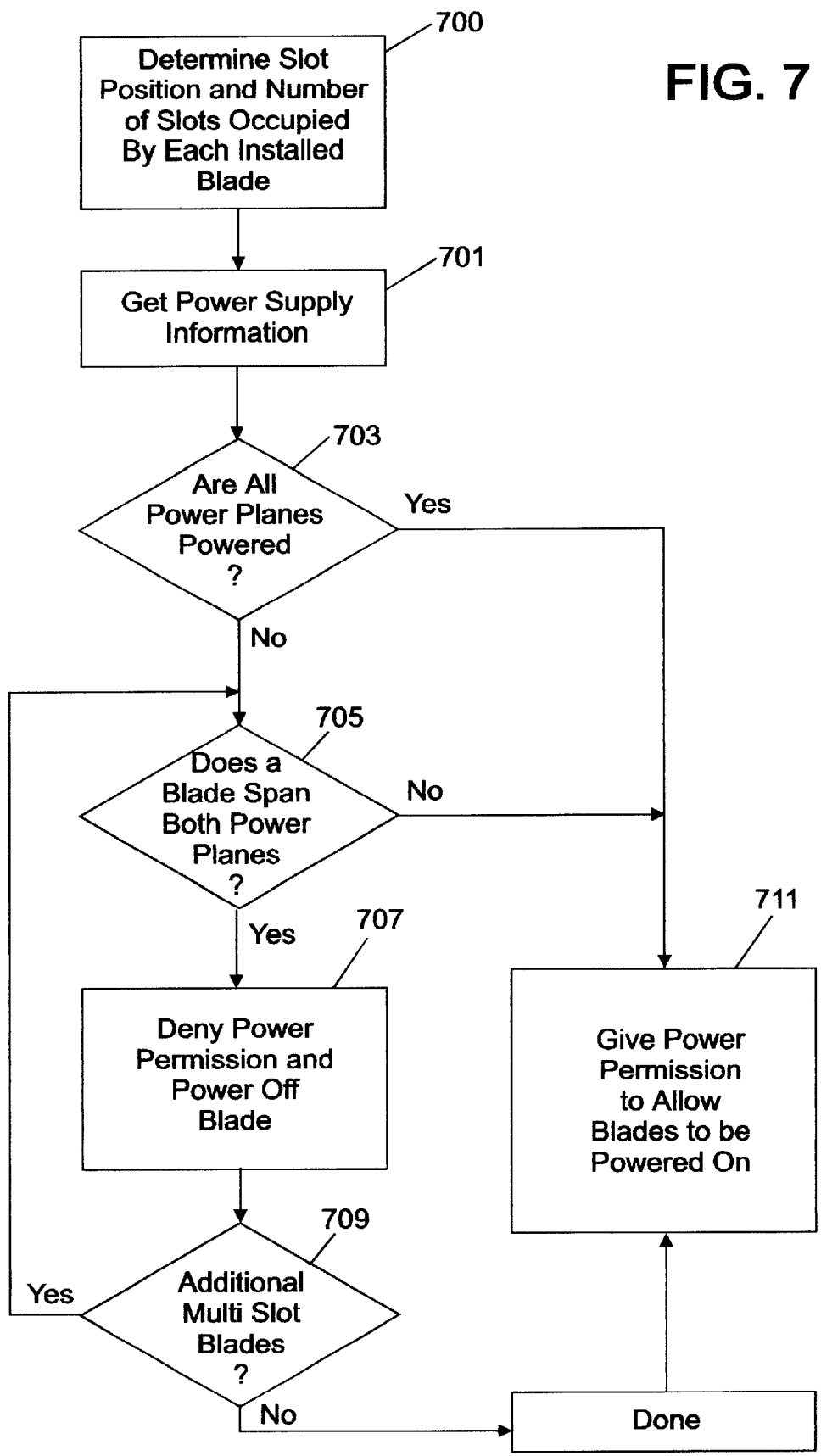
FIG. 7 depicts one method of operating a chassis.

FIG. 7 depicts a method of controlling chassis. Step 700 the chassis controller requests or obtains from each blade the slot position and width of each blade installed in the chassis. The blade width may be expressly provided by or made accessible by the blade's service processor or it may be derived from other available information such as blade type or product type or other blade configuration information. The chassis controller needs to determine which slots the multi-wide blade occupies and which slots are drawing power. This information might be provided in the blade configuration data for instance a multi-slot orientation data which might use an offset to the plane containing the blade's service processor so that −1 +1 for a triple wide blade would indicate slots on either side of the slot occupied by the service processor require power, likewise +1 +2 indicates the next two highest slots from the slot containing the service processor, or −1 −2 indicates the next two lower slots require power . The chassis controller may also be able to sense the presence of the power drawing planes without a service processor. A convention might also be agreed to such as the service processor will always be in the lowest numbered slot or alternatively the service processor will always be in the highest number slot.

In step 701, the chassis controller checks on the presence and availability of all power supplies in the chassis. Thus, if the chassis is capable of operating with three power supplies providing power to three separate power planes then each supply is checked. This may be implemented by reading presence and status information associated with each power supply. Step 703 recognizes that if all power supplies are in the chassis and operating properly there can be no problem with a blade spanning multiple power planes. In step 705, the chassis controller determines if a blade crosses a power plane. Only multi-slot blades will cross a power plane. Power plane boundary information may be hardwired into the chassis controller software or may be stored in chassis configuration data. The chassis controller uses the blade width, main slot number (slot having the service processor) and power boundary information or power plane information to determine if a blade crosses a power plane boundary.

Referring to FIG. 3, assuming that power supply B was not present step 705 would identify blade 309 as spanning the power plane boundary but, not double wide server blade 307. In step 707 power permission would be denied to the blade 309. Note that triple wide server blade 311 would not be sensed as its service processor has no power to operate. The method can then be repeated as need be for any other X-wide blades. The chassis controller would enable power for double wide blade 307. The chassis controller upon identifying a blade that crosses a power plane boundary can store this information in its configuration data to more quickly determine which blades cross power plane boundaries. This information can be put in a look up table that gets modified when the chassis configuration changes. The table or data can be added to when blades are installed and modified when blades are removed.

Upon insertion of a blade, the chassis controller determines the slot position of the installed blade and the blade width as set forth above. The chassis controller then performs steps similar to those set forth in FIG. 7 except that they are carried out with respect to the newly installed blade. Once again power plane crossing information may be stored with chassis configuration data. This makes identifying multi slot wide blades quick in the event of a power supply failure or removal event or in case a power supply is inserted. If a power supply is inserted than a multiple slot blade previously denied power permission may be granted power up permission by the chassis controller.

In an alternative embodiment the chassis controller may deny any blade that crosses a power plane boundary from going to full power up operation. This could be the case if the multi-wide blade shared a common DC power bus throughout the blade (e.g., common across the planes of the blade). The blade could get damaged if it were to draw power from two or more power supplies or other components in the chassis may get damaged.

It should be understood that the present invention contains one or more software systems. Software systems that operate in the a blade's service processor and the chassis controller to carry the functions described above. In this context, a software system is a collection of one or more executable software programs, and one or more storage areas (for example, RAM, ROM, cache, disk, flash memory, compact flash, EEPROM, PCMCIA, CD-ROM, Server's Memory etc.) In general terms, a software system should be understood to comprise a fully functional software embodiment of a function or collection of functions, which can be run on an processor to provide new function to that processing system.

It should be understood in the context of the present invention that delineations between software systems are representative of the preferred implementation. However, the present invention may be implemented using any combination or separation of software or hardware systems.

While the invention has been described in detail herein in accord with certain preferred embodiments thereof, modifications and changes therein may be effected by those skilled in the art. Accordingly, it is intended by the appended claims to cover all such modifications and changes as fall within the true spirit and scope of the invention.

What is claimed:

1. A chassis comprising:
    a plurality of slots each slot capable of receiving a blade;
    a mid-plane coupled to the plurality of slots for providing power connectors and electrical signal connectors for each slot;
    a first power module for supplying DC power to a first number of slots;
    a power module receptacle adapted for receiving a second power module for supplying DC power to a second number of slots;
    a multi-slot blade with at least one power connector for each slot occupied by the multi-slot blade, the multi-slot blade having at least one electrical signal interface for communicating with a chassis controller;
    a chassis controller electrical coupled to each slot via electrical signal interface, the chassis controller in response to insertion of the multi-slot blade determines that all slots occupied by the multi-slot blade are powered properly prior to permitting the multi-slot blade to go to full power mode.

2. The chassis according to claim 1, wherein the chassis controller checks to determine whether different slots occupied by the multi-slot blade are supplied from different power modules.

3. The chassis according to claim 1, wherein the chassis controller checks to determine that the slots occupied by the multi slot blade are powered by the first power module.

4. The chassis according to claim 2, wherein the chassis controller checks to determine that the slots occupied by the multi slot blade are powered by the first power module.

5. The chassis according to claim 1, wherein the chassis controller denies permission for the multi-slot blade to go to full power mode, if the blade occupies at least one slot of the second number of slots.

6. The chassis of claim 1 wherein the multi-slot blade has at least two power modes:
    a first mode provides power only to a service processor in the blade; and
    a second mode provides full power to the blade.

* * * * *